United States Patent
Ishigaki et al.

(10) Patent No.: US 7,790,354 B2
(45) Date of Patent: Sep. 7, 2010

(54) PHOTOSENSITIVE RESIN COMPOSITION, CURED PRODUCT THEREOF AND PRODUCTION METHOD OF PRINTED CIRCUIT BOARD USING THE SAME

(75) Inventors: Satoru Ishigaki, Kawasaki (JP); Hiroshi Uchida, Kawasaki (JP); Yoshio Miyajima, Kawasaki (JP); Katsutoshi Morinaka, Fukushima (JP)

(73) Assignee: Showa Denko K.K., Tokyo (JP)

( * ) Notice: Subject to any disclaimer, the term of this patent is extended or adjusted under 35 U.S.C. 154(b) by 266 days.

(21) Appl. No.: 11/587,162

(22) PCT Filed: Apr. 21, 2005

(86) PCT No.: PCT/JP2005/008100

§ 371 (c)(1),
(2), (4) Date: Oct. 20, 2006

(87) PCT Pub. No.: WO2005/103822

PCT Pub. Date: Nov. 3, 2005

(65) Prior Publication Data

US 2007/0218305 A1    Sep. 20, 2007

Related U.S. Application Data

(60) Provisional application No. 60/566,593, filed on Apr. 30, 2004.

(30) Foreign Application Priority Data

Apr. 22, 2004    (JP)    ............... 2004-127186

(51) Int. Cl.
G03F 7/00    (2006.01)
G03F 7/004    (2006.01)
G03F 7/035    (2006.01)

(52) U.S. Cl. ............. 430/280.1; 430/270.1; 430/281.1; 430/284.1; 430/287.1; 430/311; 430/320; 430/330; 523/160

(58) Field of Classification Search .............. 523/160; 430/281.1, 284.1, 287.1, 288.1, 311, 320, 430/330
See application file for complete search history.

(56) References Cited

U.S. PATENT DOCUMENTS

| 4,717,643 | A | | 1/1988 | Scheve et al. |
| 5,089,376 | A | * | 2/1992 | Setthachayanon ........ 430/284.1 |
| 5,364,903 | A | * | 11/1994 | Takayama et al. ........... 524/555 |
| 5,849,463 | A | * | 12/1998 | Tsuji et al. .................. 430/302 |
| 6,458,509 | B1 | * | 10/2002 | Haruta ....................... 430/280.1 |
| 6,582,862 | B1 | | 6/2003 | Nakamura et al. |
| 6,620,887 | B2 | * | 9/2003 | Fujimoto et al. ............ 525/193 |
| 6,818,382 | B2 | * | 11/2004 | Tamura et al. ........... 430/281.1 |
| 7,144,605 | B2 | * | 12/2006 | Kanakura et al. ........... 427/517 |
| 2002/0192596 | A1 | | 12/2002 | Ueda et al. |

FOREIGN PATENT DOCUMENTS

| EP | 0 259 726 A2 | | 3/1988 |
| EP | 360579 A1 | * | 3/1990 |
| EP | 0 977 085 A1 | | 2/2000 |
| EP | 1 035 439 A2 | | 9/2000 |
| EP | 1 094 364 A1 | | 4/2001 |
| KR | 2003-0008212 A | | 1/2003 |
| KR | 2003-0051419 A | | 6/2003 |
| WO | WO 95/00573 A1 | | 1/1995 |
| WO | WO 01/73510 A1 | | 10/2001 |
| WO | WO 02/23273 A2 | | 3/2002 |
| WO | WO 03/005126 A1 | | 1/2003 |

\* cited by examiner

*Primary Examiner*—Amanda C. Walke
(74) *Attorney, Agent, or Firm*—Sughrue Mion, PLLC

(57) ABSTRACT

There are provided a novel photosensitive resin composition, a cured film of which has ample flexibility, and which yields an insulating protective coating having superior soldering heat resistance, thermal degradation resistance and electroless gold plating resistance. The photosensitive resin composition as claimed in the present invention comprises: a photopolymerizable component containing a urethane acrylate compound (A) and a compound (B) having an ethylenic unsaturated group other than said urethane acrylate compound (A), a thermosetting resin (C), a photopolymerization initiator (D) and a thermal polymerization catalyst (E); wherein, said urethane acrylate compound (A) is the reaction product of an isocyanate compound (a-1) of the following general formula (1):

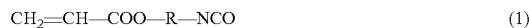

$$CH_2=CH-COO-R-NCO \qquad (1)$$

(wherein, R represents a hydrocarbon group having 1 to 30 carbon atoms) with a polyhydroxy compound (a-2).

14 Claims, No Drawings

PHOTOSENSITIVE RESIN COMPOSITION, CURED PRODUCT THEREOF AND PRODUCTION METHOD OF PRINTED CIRCUIT BOARD USING THE SAME

CROSS-REFERENCES TO RELATED APPLICATIONS

This application claims benefit under 35 U.S.C. section 119(e) to U.S. Provisional Application Ser. No. 60/566,593 filed Apr. 30, 2004.

TECHNICAL FIELD

The present invention relates to a composition used for an insulating protective coating for a printed circuit (wiring) board and so forth, its cured product, curing method and the use of said composition. More particularly, the present invention relates to a resin composition that yields a cured product having superior flexibility (bendability), soldering heat resistance, chemical resistance, electroless gold plating resistance and so forth that is useful as solder resist for a flexible printed wiring board, a plating resist and an interlayer electrically insulating material for a multilayer printed wiring board, and to a dry film resist obtained there from.

BACKGROUND ART

During the process of soldering when surface mounting electronic components on a printed wiring board by protecting the wiring (circuit) pattern formed by a method such as screen printing on the board from the external environment, in order to protect the printed wiring board so that solder is not adhered to those portions where it is not required, a protective layer referred to as a cover coat or solder mask is covered over the printed wiring board.

Although primarily multifunctional epoxy resin-based compounds were used in the past for the solder resists used in such applications, although the resulting cured film has satisfactory heat resistance, it had the problem of low flexibility (see Patent Document 1 below). Thus, the applications of this solder resist were limited to rigid boards not requiring flexibility (bendability) of the cured film, and this solder resist had difficulty in being used for flexible printed circuit (wiring) boards (FPC) which have come to be used frequently in recent years.

In consideration of these circumstances, numerous solder resists having flexibility have been proposed in recent years, and the present applicant, for example, proposed the use of a composition containing a urethane (meth)acrylate compound having a carboxyl group as a coating material of FPC boards and other printed wiring boards (see Patent Document 2 below).

Although this composition has superior flexibility and can be adequately applied to FPC boards, further improvement of performance is sought with respect to electroless gold plating resistance.

[Patent Document 1] Japanese Unexamined Patent Publication No. 11-228688

[Patent Document 2] Japanese Unexamined Patent Publication No. 2002-229201

SUMMARY OF THE INVENTION

An object of the present invention is to provide a composition that yields an insulating protective coating for which the cured film has abundant flexibility and which has superior soldering heat resistance, thermal degradation resistance, electroless gold plating resistance, and a dry film resist obtained there from. In addition, an object of the present invention is to provide a dry film resist for a flexible printed wiring board in particular.

As a result of conducting extensive studies, the inventors of the present invention found that when a composition containing a specific urethane acrylate compound (A) is used as the coating material of a printed wiring board such as an FPC board, an insulating protective coating is obtained having extremely superior characteristics not found in the prior art, thereby leading to completion of the present invention.

Namely, the present invention includes the matters described in (1) through (17) below.

(1) A photosensitive resin composition comprising: a photopolymerizable component containing a urethane acrylate compound (A) and a compound (B) having an ethylenic unsaturated group other than said urethane acrylate compound (A), a thermosetting resin (C), a photopolymerization initiator (D) and a thermal polymerization catalyst (E); wherein, said urethane acrylate compound (A) is the reaction product of an isocyanate compound (a-1) of the following general formula (1):

$$CH_2=CH—COO—R—NCO \qquad (1)$$

(wherein, R represents a hydrocarbon group having 1 to 30 carbon atoms) with a polyhydroxy compound (a-2).

(2) A photosensitive resin composition according to (1) above wherein the polyhydroxy compound (a-2) is at least one type of compound selected from the group consisting of the following (I) through (V):
(I) polyester polyol compounds;
(II) polycarbonate polyol compounds;
(III) polyalkylene oxide compounds;
(IV) polyurethane polyol compounds; and,
(V) hydroxyalkyl (meth)acrylate homopolymers or copolymers.

(3) A photosensitive resin according to (1) above wherein the urethane acrylate compound (A) has a carboxyl group.

(4) The photosensitive resin composition according to (3) above wherein the number average molecular weight of the urethane acrylate compound (A) is 1,000 to 40,000, and the acid value of the urethane acrylate compound (A) is 5 to 150 mg KOH/g.

(5) The photosensitive resin composition according to (1) above further comprising an organic solvent.

(6) The photosensitive resin composition according to (5) above wherein the viscosity of the composition at 25° C. is 500 to 500,000 mPa·s.

(7) The photosensitive resin composition according to (1) above wherein the thermosetting resin (C) is an epoxy resin.

(8) The photosensitive resin composition according to (1) above wherein the composition is used as a resist.

(9) The photosensitive resin composition according to (1) above wherein the composition is used as a solder resist.

(10) A dry film resist having on a support a photosensitive layer formed from the photosensitive resin composition according to (1) above.

(11) The dry film resist according to (10) above wherein the support is a polyester film.

(12) A process for the preparation of a dry film resist having a photosensitive layer formation step in which the photosensitive resin composition according to (1) above is coated onto a support and dried.

(13) A cured product formed from the photosensitive resin composition according to (1) above.

(14) An insulating protective coating formed using the photosensitive resin composition according to (1) above.

(15) A printed circuit board having the insulating protective coating according to (14) above.

(16) The printed circuit board according to (15) above that is a flexible printed wiring board.

(17) A process for the preparation of a printed circuit board comprising a lamination step in which a photosensitive layer of the dry film resist according to (10) or (11) above and a substrate are laminated, an exposure step in which the photosensitive layer is exposed, a developing step following the exposure step, and a thermosetting step in which the photosensitive layer is heat-cured.

DETAILED DESCRIPTION OF THE INVENTION

The following provides a detailed explanation of the present invention. A photosensitive resin composition of the present invention contains a urethane acrylate compound (A) that is the reaction product of an isocyanate compound (a-1) of the following general formula (1):

(wherein R represents a hydrocarbon group having 1 to 30 carbon atoms) with a polyhydroxy compound (a-2). In the present invention, an improvement in electroless gold plating resistance is not observed in the case of using another urethane acrylate instead of (A) or in the case of having converted the acryloyl group of (A) to a methacryloyl group.

In the aforementioned general formula (1), R represents a hydrocarbon group having 1 to 30 carbon atoms, specific examples of which include a methylene group, ethylene group, 1,2-propylene group, 1,3-propylene group and 1,4-butylene group.

Specific examples of a isocyanate compound (a-1) represented by the aforementioned general formula (1) include 2-acryloyloxyethylisocyanate and 4-acryloyloxybutylisocyanate.

Polyhydroxy compound (a-2) used in the present invention is a compound that has 2 or more hydroxyl groups in a single molecule, and is preferably one or more types of a compound selected from the group consisting of (I) through (V) below.

(I) Polyester Polyol Compound

A polyester polyol compound used in the present invention is a compound that has 2 or more hydroxyl groups and 1 or more ester bonds in a single molecule, examples of which include polyester polyol obtained from polyvalent alcohols and polybasic acid esters, and polylactone dioles such as polycaprolactone diol and polybutyrolactone diol. Compounds synthesized so that the carboxyl group remains can also be used for these compounds.

(II) Polycarbonate Polyol Compounds

A polycarbonate polyol compound used in the present invention is a compound that has two or more hydroxyl groups and 1 or more carbonate bond in a single molecule, and is preferably a compound represented by the following general formula (2):

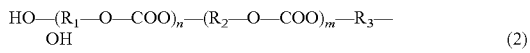

(wherein $R_1$, $R_2$ and $R_3$ respectively and independently represent a linear, branched or cyclic hydrocarbon group which may or may not have a hydroxyl group and/or carboxyl group, m and n respectively and independently represent an integer of 0 or 1 to 100, and the total of m and n is 1 or more).

The aforementioned $R_1$, $R_2$ and $R_3$ preferably represent an alkylene group having 2 to 12 carbon atoms, specific examples of which include an ethylene group, trimethylene group, tetramethylene group, pentamethylene group, hexamethylene group, propylene, 2,2-dimethyl-1,3-propylene group, 1,2-cyclohexylene group, 1,3-cyclohexylene group and 1,4-cyclohexylene group.

These polycarbonate polyols can be obtained, for example, by reacting a diaryl carbonate such as diphenyl carbonate with a polyols such as ethylene glycol, tetramethylene glycol, hexamethylene glycol, trimethylol ethane, trimethylol propane, glycerin or sorbitol.

(III) Polyalkylene Oxides

A polyalkylene oxide used in the present invention is a compound having a structure in which 2 or more alkylene glycols are dehydrated and condensed, and known compounds can be used. These are produced by condensation of an alkylene glycol or ring-opening polymerization of an alkylene oxide. Specific examples of alkylene glycols include ethylene glycol, propylene glycol, 1,4-butanediol, 1,3-butanediol, 1,5-pentanediol, neopentyl glycol, 3-methyl-1,5-pentanediol, 1,6-hexanediol and 1,4-cyclohexane dimethanol. In addition, examples of alkylene oxides include ethylene oxide, propylene oxide, tetrahydrofuran, styrene oxide and phenyl glycidyl ether. Examples of polyalkylene oxides include polyethylene glycol, polypropylene glycol, ethylene oxide/propylene oxide copolymer, polytetramethylene glycol and polyhexamethylene glycol.

(IV) Polyurethane Polyol Compounds

A polyurethane polyol compound used in the present invention is a compound having two or more hydroxyl groups and 1 or more urethane bond in a single molecule. These are obtained by reacting a polyisocyanate and polyol by an arbitrary method. Urethane acrylate compound (A) of the present invention may be produced by simultaneously charging isocyanate compound (a-1) during this reaction. Known compounds can be used for the polyisocyanate, and specific examples of diisocyanates include 2,4-toluene diisocyanate, 2,6-toluene diisocyanate, isophorone diisocyanate, hexamethylene diisocyanate, diphenylmethylene diisocyanate, o-m- or p-xylene diisocyanate, methylene bis(cyclohexylisocyanate), trimethylhexamethylene diisocyanate, cyclohexane-1,3-dimethylene diisocyanate, cyclohexane-1,4-dimethylene diisocyanate and 1,5-naphthalene diisocyanate. One type of these polyisocyanates can be used or two or more types can be used in combination.

Examples of polyols that can be used include diol compounds such as ethylene glycol, propylene glycol, 1,4-butanediol, 1,3-butanediol, 1,5-butanediol, neopentyl glycol, 3-methyl-1,5-pentanediol, 1,6-hexanediol and 1,4-cyclohexane dimethanol, triole compounds such as glycerin and trimethylol propane, and polyol compounds such as pentaerythritol, dipentaerythritol and diglycerin.

Furthermore, polyol compounds having a carboxyl group such as dihydroxy aliphatic carboxylic acids can be used as polyol compound, and the introduction of a carboxyl group into urethane acrylate compound (A) is able to impart alkaline developing characteristics, thereby making this preferable. Examples of polyol compounds having a carboxyl group include dimethylol propionic acid and dimethylol butanoic acid. One type of these compounds can be used or 2 or more types can be used in combination.

Moreover, the aforementioned polyester polyol compounds of (I), the aforementioned polycarbonate polyol compounds of (II) and the aforementioned polyalkylene oxide compounds of (II) can also be used as polyols.

(V) Hydroxyalkyl (Meth)Acrylate Homopolymers or Copolymers

These compounds are polymers obtained by polymerizing one or more types of hydroxyalkyl (meth)acrylates by an arbitrary method. Examples of hydroxyalkyl (meth)acrylates used here include 2-hydroxyethyl (meth)acrylate, hydroxypropyl (meth)acrylate, hydroxybutyl (meth)acrylate, glycerin mono(meth)acrylate, glycerin di(meth)acrylate, trimethylol propane mono(meth)acrylate, pentaerythritol mono(meth)acrylate, dipentaerythritol mono(meth)acrylate, ditrimethylol propane mono(meth)acrylate, trimethylol propane-alkylene oxide addition product mono(meth)acrylate, 2-hydroxy-3-phenoxypropyl acrylate, polyethylene glycol (meth)acrylate and 6-hydroxyhexanoyloxyethyl (meth)acrylate. Among these, 2-hydroxyethyl (meth)acrylate, hydroxypropyl (meth)acrylate and hydroxybutyl (meth)acrylate are preferable, while 2-hydroxyethyl (meth)acrylate is particularly preferable. One type of these (meth)acrylates having a hydroxyl group can be used or two or more types can be used in combination.

Constituents other than hydroxyalkyl (meth)acrylates that compose the copolymer are unsaturated compounds that are copolymerizable therewith, specific examples of which include alkyl (meth)acrylates such as methyl (meth)acrylate, ethyl (meth)acrylate, propyl (meth)acrylate, butyl (meth)acrylate, isobutyl (meth)acrylate, sec-butyl (meth)acrylate, tert-butyl (meth)acrylate, hexyl (meth)acrylate, octyl (meth)acrylate, isooctyl (meth)acrylate, 2-ethylhexyl (meth)acrylate, decyl (meth)acrylate, lauryl (meth)acrylate and stearyl (meth)acrylate; alicyclic (meth)acrylates such as cyclohexyl (meth)acrylate, bornyl (meth)acrylate, isobornyl (meth)acrylate, dicyclopentyl (meth)acrylate and dicyclopentyloxyethyl (meth)acrylate; aromatic (meth)acrylates such as benzyl (meth)acrylate, phenyl (meth)acrylate, phenyl carbitol (meth)acrylate, nonylphenyl (meth)acrylate, nonylphenyl carbitol (meth)acrylate and nonylphenoxy (meth)acrylate; (meth)acrylates having an amino group such as 2-dimethylaminoethyl (meth)acrylate, 2-diethylaminoethyl (meth)acrylate and 2-tert-butylaminoethyl (meth)acrylate; methacrylates having a phosphorous atom such as methacryloxy ethyl phosphate, bis-methacryloxy ethyl phosphate and methacryloxy ethyl phenyl acid phosphate (phenyl-P); glycidyl (meth)acrylate; allyl (meth)acrylates; and, phenoxyethyl acrylate.

Moreover, unsaturated compounds having a carboxyl group or acid anhydride group can also be used, examples of which include (meth)acrylic acid, itaconic acid, maleic anhydride, itaconic anhydride, polycaprolactone (meth)acrylate; (meth)acryloyloxy ethyl phthalate; and, (meth)acryloyloxy ethyl succinate.

In addition, N-vinyl compounds such as N-vinylpyrrolidone, N-vinylformamide and N-vinylacetamide, and vinyl aromatic compounds such as styrene and vinyl toluene can also be used preferably. Compounds that are used preferably consist of unsaturated carboxylic acids such as (meth)acrylic acid, and alkyl or arylalkyl (meth)acrylates such as methyl (meth)acrylate and benzyl (meth)acrylate.

The number average molecular weight of urethane acrylate compound (A) used in the present invention is preferably 1,000 to 40,000, and more preferably 8,000 to 30,000. If the number average molecular weight is less than 1,000, the elongation and strength of a cured film composed of the composition of the present invention may be impaired, while if the number average molecular weight exceeds 40,000, there is the risk of the cured film becoming hard and having decreased flexibility. Here, the number average molecular weight is the value as polystyrene as measured by gel permeation chromatography.

The acid value of urethane acrylate compound (A) used in the present invention is preferably 5 to 150 mg KOH/g, and more preferably 30 to 120 mg KOH/g. If the acid value is less than 5 mg KOH/g, the alkaline developing characteristics may decrease, while if the acid value exceeds 150 mg KOH/g, the alkaline resistance, electrical characteristics and so forth of a cured film may be impaired.

Furthermore, urethane acrylate compound (A) can also be used by combining two types of urethane acrylate compounds (A) having carboxyl groups with different acid values, and in this case, particularly superior flexibility and satisfactory developing characteristics can both be attained.

The selection of at least one type each of a urethane acrylate compound having a carboxyl group with an acid value of 5 to 60 mg KOH/g and a urethane acrylate compound having a carboxyl group with an acid value of 60 to 150 mg KOH/g is particularly preferable. In addition, the usage ratios in the case of using in combination is preferably such that the urethane acrylate compound having an acid value of 5 to 60 mg KOH/g is in excess. More specifically, the weight ratio of the urethane acrylate compound having a carboxyl group with an acid value of 5 to 60 mg KOH/g to the urethane acrylate compound having a carboxyl group with an acid value of 60 to 150 mg KOH/g is preferably within the range of 60/40 to 90/10 in 100 parts by weight of urethane acrylate compound (A).

Compound (B) having an ethylenic unsaturated group contained in the photopolymerizable component in the composition is a compound other than urethane acrylate compound (A) that is used for the purpose of adjusting the viscosity of the composition and/or adjusting the heat resistance, flexibility or other physical properties when the composition is cured. A (meth)acrylic ester is used preferably. Specific examples include alkyl (meth)acrylates such as methyl (meth)acrylate, ethyl (meth)acrylate, propyl (meth)acrylate, butyl (meth)acrylate, isobutyl (meth)acrylate, sec-butyl (meth)acrylate, tert-butyl (meth)acrylate, hexyl (methacrylate), octyl (meth)acrylate, isooctyl (meth)acrylate, 2-ethylhexyl (meth)acrylate, decyl (meth)acrylate, lauryl (meth)acrylate and stearyl (meth)acrylate; alicyclic (meth)acrylates such as cyclohexyl (meth)acrylate, bornyl (meth)acrylate, isobornyl (meth)acrylate, dicyclopentyl (meth)acrylate and dicyclopentyloxyethyl (meth)acrylate; aromatic (meth)acrylates such as benzyl (meth)acrylate, phenyl (meth)acrylate, phenyl carbitol (meth)acrylate, nonylphenyl (meth)acrylate, nonylphenyl carbitol (meth)acrylate and nonylphenoxy (meth)acrylate; (meth)acrylates having a hydroxyl group such as 2-hydroxyethyl (meth)acrylate, hydroxypropyl (meth)acrylate, hydroxybutyl (meth)acrylate, butanediol mono(meth)acrylate, glycerol (meth)acrylate, phenoxyhydroxypropyl (meth)acrylate, polyethylene glycol (meth)acrylate and glycerol di(meth)acrylate; (meth)acrylates having an amino group such as 2-dimethylaminoethyl (meth)acrylate, 2-diethylaminoethyl (meth)acrylate and 2-tert-butylaminoethyl (meth)acrylate; methacrylates having a phosphorous atom such as methacryloxy ethyl phosphate, bis-methacryloxy ethyl phosphate and methacryloxy ethyl phenyl acid phosphate (phenyl-P); diacrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, 1,4-butanediol di(meth)acrylate, 1,3-butanediol di(meth)acrylate, neopentyl glycol di(meth)acrylate, 1,6-hexanediol di(meth)acrylate, bis-glycidyl (meth)acrylate; polyacrylates such as trimethylol propane tri(meth)acrylate, pentaerythritol tri(meth)acrylate and dipentaerythritol hexa(meth)acrylate; modified polyol polyacrylates such as ethylene oxide tetramolar-modified diacrylates of bisphenol S, ethylene oxide tetramolar-modified diacrylates of bisphenol A, fatty acid-modified pentaerythritol diacrylates, propylene oxide trimolar-modified triacrylates of trimethylol propane and propylene oxide hexamolar-modified triacrylates of trimethylol propane; polyacrylates having an isocyanuric acid backbone such as bis(acryloyloxyethyl) monohydroxyethyl isocyanurate, tris(acryloyloxyethyl) isocyanurate and ε-caprolactone-modified tris(acryloyloxyethyl) isocyanurate; polyester acrylates such as α,ω-diacryloyl-(bis-ethylene glycol)-phthalate and α,ω-tetraacryloyl-(bistrimethylol propane)-tetrahydrophthalate; glycidyl (meth)acrylate; allyl (meth)acrylates; co-hydroxyhexanoyloxyethyl (meth)acrylate; (meth)acryloyloxyethyl succinate; 2-hydroxy-3-phenoxypropyl acrylate; and, phenoxyethyl acrylate.

In addition, N-vinyl compounds such as N-vinylpyrrolidone, N-vinylformamide and N-vinylacetamide as well as polyester acrylates, urethane acrylates and epoxy acrylates and so forth can also be preferably used for compound (B) having an ethylenic unsaturated group. Examples of these preferable compounds include (meth)acrylates having a hydroxyl group, glycidyl (meth)acrylates and urethane (meth)acrylates, and examples of (meth)acrylates having a hydroxyl group include 2-hydroxyethyl (meth)acrylate, hydroxypropyl (meth)acrylate, hydroxybutyl (meth)acrylate and urethane acrylate. In addition, compound (B) preferably has three or more ethylenic unsaturated groups in consideration of increasing heat resistance.

The blending ratio of urethane acrylate compound (A) to compound (B) having an ethylenic unsaturated group other than said urethane acrylate compound (A) is a weight ratio of 95:5 to 50:50, preferably 90:10 to 60:40, and more preferably 85:15 to 70:30. If the blended amount of the urethane acrylate compound (A) component exceeds 95% by weight, the soldering heat resistance of a cured film composed of the composition may decrease, while if the blended amount of the urethane acrylate compound (A) component is less than 50% by weight, the alkaline solubility of the composition tends to decrease.

In addition, an epoxy (meth)acrylate compound (F) having a carboxyl group may additionally be used as necessary in the photopolymerizable component of the composition. Epoxy (meth)acrylate compound (F) having a carboxyl group is obtained by additionally reacting an acid anhydride with the reaction product of an epoxy compound and (meth)acrylic acid. There are no particular limitations on the epoxy compound used here, and examples include bisphenol A type epoxy compounds, bisphenol F type epoxy compounds, bisphenol S type epoxy compounds, phenol Novolak type epoxy compounds, cresol Novolak type epoxy compounds and aliphatic epoxy compounds. Examples of acid anhydrides include dibasic acid anhydrides such as maleic anhydride, succinic anhydride, itaconic anhydride, phthalic anhydride, tetrahydrophthalic anhydride, hexahydrophthalic anhydride, methyl hexahydrophthalic anhydride, endomethylene tetrahydrophthalic anhydride, methyl endomethylene tetrahydrophthalic anhydride, chlorendic anhydride and methyl tetrahydro phthalic anhydride, aromatic polyvalent carboxylic anhydrides such as trimellitic anhydride, pyromellitic anhydride and benzophenone tetracarboxylic dianhydride, 5-(2,5-dioxotetrahydrofuryl)-3-methyl-3-cyclohexene-1,2-dicarboxylic anhydride, and endobicyclo-[2,2,1]-hepto-5-ene-2,3-dicarboxylic anhydride.

In addition, the acid value of epoxy (meth)acrylate compound (F) having a carboxyl group is 10 mg KOH/g or more, preferably 45 to 160 mg KOH/g, and more preferably 50 to 140 mg KOH/g. The use of an epoxy (meth)acrylate compound (F) having such an acid value makes it possible to improve the balance between the alkaline solubility of the composition and the alkaline resistance of a cured film. If the acid value is less than 10 mg KOH/g, alkaline solubility becomes poor, and conversely if it is too large, the alkaline resistance, electrical characteristics and other characteristics as a resist of the cured film may decrease depending on the constituents of the composition. In the case of using an epoxy (meth)acrylate compound (F) having a carboxyl group, it is preferable to use within a range of 100 parts by weight or less relative to 100 parts by weight of urethane acrylate compound (A) having a carboxyl group.

Thermosetting resin (C) used in the present invention is contained in the composition in the form of a thermosetting component, and this thermosetting resin (C) may be that which itself is cured by heat or that which is caused to react with a carboxyl group of urethane acrylate compound (A) by heat. Specific examples include epoxy resins, phenol resins, silicone resins, melamine derivatives (such as hexamethoxymelamine, hexabutoxymelamine and condensed hexamethoxymelamine), urea compounds (such as dimethylol urea), bisphenol A compounds (such as tetramethylol bisphenol A), oxazoline compounds and oxetane compounds. One type of these thermosetting resins can be used or two or more types can be used in combination. Among these, epoxy resins are preferable, and specific examples of epoxy resins include epoxy compounds having two or more epoxy groups in a single molecule such as bisphenol A type epoxy resin, hydrogenated bisphenol A type epoxy resin, brominated bisphenol A type epoxy resin, bisphenol F type epoxy resin, Novolak type epoxy resin, phenol Novolak type epoxy resin, cresol Novolak type epoxy resin, N-glycidyl type epoxy resin, bisphenol A Novolak type epoxy resin, chelating epoxy resin, glyoxal type epoxy resin, amino group-containing epoxy resin, rubber-modified epoxy resin, dicyclopentadiene phenolic type epoxy resin, silicone-modified epoxy resin and ε-caprolactone-modified epoxy resin. In addition, epoxy resins may be used chlorine, bromine or other halogens or phosphorous and other atoms are introduced into the structure in a bonded state resistant to degradation by heat and water in order to impart flame resistance. Moreover, bisphenol S type epoxy resin, diglycidyl phthalate resin, heterocyclic epoxy resin, bixylenol type epoxy resin, biphenyl type epoxy resin and tetraglycidyl xylenoyl ethane resin may also be used. One type of these epoxy resins may be used or two or more types may be used in combination.

In a composition of the present invention, the blended amount of thermosetting component thermosetting resin (C) is preferably 10 to 150 parts by weight and more preferably 10 to 50 parts by weight relative to a total of 100 parts by weight of the photopolymerizable components. If the blended amount of thermosetting resin (C) is less than 10 parts by weight, the soldering heat resistance of a cured film composed of the composition may be inadequate. On the other hand, if the blended amount exceeds 150 parts by weight, the amount of contraction of the cured film increases, and if the cured film is used for the insulating protective coating of an FPC board, warping deformation (curling) tends to increase.

Examples of the photopolymerization initiator (D) used in the present invention include benzophenones such as benzophenone, benzoyl benzoic acid, 4-phenylbenzophenone, hydroxybenzophenone and 4,4'-bis-(diethylamine)benzophenone; benzoin alkyl ethers such as benzoin, benzoin ethyl ether, benzoin isopropyl ether, benzoin butyl ether and benzoin isobutyl ether; acetophenones such as 4-phenoxydichloroacetophenone, 4-t-butyl-dichloroacetophenone, 4-t-butyl-trichloroacetophenone, diethoxyacetophenone and 2-benzyl-2-dimethylamino-1-(4-morpholinophenyl)-butanone-1; thioxanthenes such as thioxanthene, 2-chlorothioxanthene, 2-methylthioxanthene and 2,4-dimethylthioxanthene; alkyl anthraquinones such as ethyl anthraquinone and butyl anthraquinone; acyl phosphine oxides such as 2,4,6-trimethylbenzoyldiphenyl phosphine oxide; benzyldimethyl ketals such as 2,2-dimethoxy-1,2-diphenylethan-1-one; α-amino ketones such as 2-methyl-1-[4-(methylthio)phenyl]-2-morpholinopropan-1-one and 2-benzyl-2-dimethylamino-1-(4-morpholinophenyl)-butanone-1; α-hydroxy ketones such as 2-hydroxy-2-methyl-1-phenyl-propan-1-one and 1-[4-(2-hydroxyethoxy)phenyl]-2-hydroxy-2-methyl-propan-1-one; and, 9,10-phenanthrenequinone. These can be used alone or 2 or more types can be used as a mixture. In addition, a photointensifier can also be used in combination as necessary.

Among these photopolymerization initiators (D), benzophenones, acetophenones, acyl phosphine oxides, α-amino ketones and α-hydroxy ketones are preferable, while 4,41-bis(diethylamine)benzophenone, 2-benzyl-2-dimethylamino-1-(4-morpholinophenyl)-butanone-1,2,4,6-trimethylbenzoyldiphenyl phosphine oxide, 2-methyl-1-[4-(methylthio)phenyl]-2-morpholinopropan-1-one, 2-benzyl-2-dimethylamino-1-(4-morpholinophenyl)-butanone-1 and 1-hydroxy-cyclohexyl-phenyl ketone are particularly preferable due to their high wavelength absorption efficiency and high activity.

The blended amount of these photopolymerization initiators (D) is preferably 0.1 to 20 parts by weight and more preferably 0.2 to 10 parts by weight relative to a total of 100 parts by weight of urethane acrylate compound (A), compound (B) having an ethylenic unsaturated group other than said urethane acrylate compound (A), and epoxy (meth)acrylate compound (F) having a carboxyl group that is blended as necessary. If the blended amount of photopolymerization initiator (D) is less than 0.1 part by weight, curing of the composition may be inadequate.

Thermal polymerization catalyst (E) used in the present invention demonstrates an action that heat cures thermosetting resin (C), and examples of catalysts that can be used include amines, amine salts such as chlorides of said amines, quaternary ammonium salts, acid anhydrides such as cyclic aliphatic acid anhydrides, aliphatic acid anhydrides and aromatic acid anhydrides, polyamides, imidazoles, nitrogen-containing heterocyclic compounds such as triazine compounds and organometallic compounds. One type of these catalysts can be used or 2 or more types can be used in combination.

Examples of amines include aliphatic or aromatic primary, secondary and tertiary amines. Examples of aliphatic amines include polymethylene diamine, polyether diamine, diethylene triamine, triethylene triamine, tetraethylene pentamine, triethylene tetramine, dimethylaminopropyl amine, menthene diamine, aminoethyl ethanol amine, bis(hexamethylene) triamine, 1,3,6-trisaminomethyl hexane, tributyl amine, 1,4-diazabicyclo[2,2,2]octane and 1,8-diazabicyclo[5,4,0]undecene-7-ene. Examples of aromatic amines include metaphenylene diamine, diaminodiphenyl methane, diaminodiphenyl ethane and diaminodiphenyl sulfone.

Examples of acid anhydrides include aromatic acid anhydrides such as phthalic anhydride, trimellitic anhydride, benzophenone tetracarboxylic anhydride, ethylene glycol bis(anhydrotrimellitate) and glycerol tris(anhydrotrimellitate), and maleic anhydride, succinic anhydride, methylnagic anhydride, hexahydrophthalic anhydride, tetrahydrophthalic anhydride, polyadipic anhydride, chlorendic anhydride and tetrabromophthalic anhydride.

Examples of polyamides include polyamino amides having a primary or secondary amino group obtained by a condensation reaction of a polyamine such as diethylene triamine or triethylene tetramine to a dimer acid.

Specific examples of imidazoles include imidazole, 2-ethyl-4-methylimidazole, N-benzyl-2-methylimidazole, 1-cyanoethyl-2-undecylimidazolium trimellitate and 2-methylimidazolium isocyanurate.

Triazine compounds are compounds having a six-member ring containing three nitrogen atoms, examples of which include melamine compounds, cyanuric acid compounds and melamine cyanurate compounds. Specific examples of melamine compounds include melamine, N-ethylene melamine and N,N',N''-triphenyl melamine. Examples of cyanuric acid compounds include cyanuric acid, isocyanuric acid, trimethyl cyanurate, tris-methyl isocyanurate, triethyl cyanurate, tris-ethyl isocyanurate, tri(n-propyl)cyanurate, tris(n-propyl)isocyanurate, diethyl cyanurate, N,N'-diethyl isocyanurate, methyl cyanurate and methyl isocyanurate. Examples of melamine cyanurate compounds include equimolar reaction products of melamine compounds and cyanuric acid compounds.

Examples of organometallic compounds include organic acid metal salts, 1,3-diketone metal complexes and metal alkoxides. Specific examples include organic acid metal salts such as dibutyl tin dilaurate, dibutyl tin maleate and zinc 2-ethylhexanoate, 1,3-diketone metal complexes such as nickel acetyl acetone and zinc acetyl acetonate, and metal alkoxides such as titanium tetrabutoxide, zirconium tetrabutoxide and aluminum butoxide.

The amount of thermal polymerization catalyst (E) used is 0.5 to 20 parts by weight and preferably 1 to 10 parts by weight relative to 100 parts by weight of thermosetting resin (C). If the amount of thermal polymerization catalyst (E) used is less than 0.5 parts by weight, the curing reaction does not proceed adequately and heat resistance may decrease. In addition, since curing is required for a long period of time and at a high temperature, this may also cause a decrease in work efficiency. If the amount used exceeds 20 parts by weight, the catalyst reacts with carboxyl groups in the composition resulting in increased susceptibility to the occurrence of gelling, decreased storage stability and other problems.

A composition of the present invention can be produced by mixing each of the aforementioned components using ordinary methods. There are no particular limitations on the mixing method, and a portion of the components may be mixed followed by mixing the remaining components, or all of the components may be mixed all at once. In addition, an organic solvent may be added to the composition as necessary to regulate the viscosity. Regulation of viscosity in this manner facilitates coating or printing on a target object such as by roller coating, spin coating, screen coating or curtain coating.

Examples of organic solvents include ketone-based solvents such as ethyl methyl ketone, methyl isobutyl ketone and cyclohexanone; ester-based solvents such as ethyl acetate, γ-butyrolactone and butyl acetate; alcohol-based solvents such as butanol and benzyl alcohol; cellusorb-based solvents, carbitol-based solvents and their ester and ether derivatives such as carbitol acetate and methyl cellusorb acetate; amide-based solvents such as N,N-dimethylformamide, N,N-dimethylacetoamide, N,N-dimethylformamide and N-methyl-2-pyrrolidone; dimethylsulfoxide; phenol-based solvents such as phenol and cresol; nitro compound-based solvents; aromatic solvents such as toluene, xylene, hexamethylbenzene and cumene; and aromatic or alicyclic-based solvents composed of hydrocarbons such as tetralin, decalin and dipentene. One type of these organic solvents can be used or two or more types can be used in combination.

The amount of organic solvent used is preferably that which regulates the viscosity of the composition to 500 to 500,000 mPa·s (as measured with a Brookfield viscometer at 25° C.), and more preferably to 1,000 to 500,000 mPa·s. This level of viscosity is suitable for coating or printing onto a target object and facilitates ease of use. In addition, the preferable amount of organic solvent used to achieve such a viscosity is 1.5 times by weight or less the solid matter other than the organic solvent. If the amount used exceeds 1.5 times by weight, the concentration of the solid matter decreases. Consequently, in the case of printing this composition onto a board and so forth, an adequate film thickness is unable to be obtained with a single printing, and may require several rounds of printing. In addition, this composition can also be used in the form of ink by adding a colorant. Examples of colorants include phthallocyanine blue, phthallocyanine green, iodine green, dysergy yellow, crystal violet, titanium oxide, carbon black and naphthalene black. In the case of using as an ink as well, the viscosity is preferably 500 to 500,000 mPa·s (as measured with a Brookfield viscometer at 25° C.).

A fluidity adjuster can also be added to the composition of the present invention to adjust fluidity. Fluidity adjusters are preferable since they are able to suitably adjust the fluidity of the composition in the case of coating onto a target object by roller coating, spin coating, screen coating or curtain coating and so forth. Examples of fluidity adjusters include inorganic or organic fillers, waxes and surfactants. Specific examples of inorganic fillers include talc, barium sulfate, barium titanate, silica, alumina, clay, magnesium carbonate, calcium carbonate, aluminum hydroxide and silicic chloride. Specific examples of organic fillers include silicone resin, silicone rubber and fluororesin. Specific examples of waxes include polyamide wax and polyethylene oxide wax. Specific examples of surfactants include silicone oil, higher fatty acid esters and amides. One type of these fluidity adjusters can be used or two or more types can be used in combination. In addition, among these fluidity adjusters, the use of an inorganic filler is not only preferable in terms of the fluidity of the composition, but also in terms of improving other characteristics of the composition such as adhesiveness and hardness.

In addition, additives such as thermal polymerization inhibitors, thickeners, antifoaming agents, leveling agents and adhesion promoters can be added to the composition as necessary. Examples of thermal polymerization inhibitors include hydroquinone, hydroquinone monomethyl ether, tert-butyl catechol, pyrogallol and phenothiazine. Examples of thickeners include asbestos, olvenite, bentonite and montmorillonite. Antifoaming agents are used to eliminate bubbles formed during printing, coating or curing, specific examples of which include acrylic-based and silicone-based surfactants. Leveling agents are used to eliminate surface irregularities in coating surfaces formed during printing and coating, specific examples of which include acrylic-based and silicone-based surfactants. Examples of adhesion promoters include imidazole-based, thiazole-based, triazole-based and silane coupling agents. In addition, other additives such as UV preventives and plasticizers for improving storage stability can also be added within a range that allows the action and effects of the present invention to be demonstrated.

The composition of the present invention can be made into a cured product by coating to a suitable thickness on a board and so forth, subjecting to heat treatment and drying, and then curing by exposing to light, developing and heat curing. Although the composition of the present invention can be used in various applications, due to its particularly superior photosensitivity and developing characteristics, and its superior board adhesiveness, insulating characteristics, heat resistance, warping deformation characteristics, flexibility and appearance in the case of curing to form a thin film, it is suitably used as an insulating protective coating of a printed wiring board. In the case of forming an insulating protective coating, an example of a method for forming this coating consists of coating the composition or ink thereof onto a board on which a circuit has been formed to a thickness of 10 μm to 100 μm, heat treating and drying for about 5 to 30 minutes at a temperature range of 60° C. to 100° C. to a thickness of 5 to 70 μm, exposing through a negative mask having a desired exposure pattern, developing with a developing solution to remove the unexposed portion, and then curing by heat curing for about 10 to 40 minutes at a temperature range of 100° C. to 180° C. Since this composition has particularly superior flexibility and superior elasticity in the case of forming into a cured product, it is particularly suitable for used in an insulating protective coating of an FPC board, allowing the obtaining of an FPC board that has little curling and superior handling ease. In addition, it may also be used as an interlayer insulating resin layer of a multilayer printed wiring board.

Activating light from a known activating light source such as a carbon arc lamp, mercury vapor arc lamp or xenon arc lamp is used for the activating light used for exposure. Since the sensitivity of the photopolymerization initiator (D) contained in the photosensitive layer normally increases in the ultraviolet region, effectively radiating with ultraviolet light as the activating light source is preferable. Naturally, in the case of a photopolymerization initiator (D) such as 9,10-phenanthrenequinone that is sensitive to visible light, an activating light source other than the aforementioned activating light sources such as a photographic flood lamp or solar lamp is used for the light source. In addition, examples of developing solutions that can be used include alkaline aqueous solutions of potassium hydroxide, sodium hydroxide, sodium carbonate, potassium carbonate, sodium phosphate, sodium silicate, ammonia and amines.

In addition, the composition of the present invention can also be used as a photosensitive layer of a dry film resist. A dry film resist has a photosensitive layer composed of the composition on a support composed of a polymer film and so forth. The thickness of the photosensitive layer is preferably 10 to 70 μm. Examples of the polymer film used for the support include films composed of polyethylene terephthalate, aliphatic polyester and other polyester resins, polypropylene, and low-density polyethylene and other polyethylenes. Among these, films composed of polyester and low-density polyethylene are preferable. In addition, since it is necessary to subsequently remove these polymer films from the photosensitive layer, a film that can be easily removed from the photosensitive layer is preferable. The thickness of these polymer films is normally 5 to 100 μm and preferably 10 to 30 μm.

The dry film resist can be produced by a photosensitive layer forming process in which the composition is coated onto the support and dried. In addition, by providing a cover film on the formed photosensitive layer, a dry film resist can also be produced in which the support, photosensitive layer are sequentially laminated and having a film on both sides of the photosensitive layer. Although the cover film is removed when the dry film resist is used, by providing a cover film on the photosensitive layer until the time it is used, the photosensitive layer can be protected resulting in a dry film resist having superior pot life. A cover film similar to the aforementioned polymer film used for the support can be used for the cover film, and the cover film and support may be the same or different materials, and their thicknesses may be the same or different.

In order to form an insulating protective coating on a printed wiring board using a dry film resist, a lamination step is first carried out in which the photosensitive layer of the dry film resist and the board are laminated. Here, in the case of using a dry film resist provided with a cover film, the dry film resist is contacted with the board after first peeling off the cover film and exposing the photosensitive layer. The photosensitive layer and board are then hot-pressed at a temperature of about 40 to 120° C. using a press roller to laminate the photosensitive layer onto the board. By then carrying out an exposure step in which the photosensitive layer is exposed through a negative mask having a desired exposure pattern, a step in which the support is removed from the photosensitive layer, a developing step in which the board is developed by removing the unexposed portion with a developing solution, and a heat curing step in which the photosensitive layer is heat-cured, a printed wiring board can be produced in which an insulating protective coating is provided on the surface of the board. In addition, an insulting protective layer may also be formed between the layers of a multilayer printed wiring board using this type of dry film resist. Furthermore, the same activating light and developing solutions previously described can be used for the activating light and developing solution used for exposure.

The use of this composition allows the formation of a cured film that has an attractive appearance and flexibility, has superior photosensitivity and developing characteristics, and satisfies performance requirements with respect to heat resistance, electrical insulation, adhesion to a printed wiring board and so forth. This cured film has particularly superior flexibility, electrical insulation and appearance. Accordingly, even in the case of using in a thin printed wiring board such as an FPC board, an insulating protective coating can be formed that is free of the occurrence of curling, has superior electrical performance and handling ease, and has satisfactory flexibility.

EXAMPLES

The following provides a more detailed explanation of the present invention through its examples. In the following Production Examples 1 to 6, UA-1 to UA-6 were synthesized as urethane (meth)acrylate compound components (A) having a carboxyl group.

Preparation Example 1

Synthesis of UA-1

625 g (0.5 mol) of polyester polyol in the form of polycaprolactone diol (Daicel Chemical Industries, PLACCEL212, molecular weight: 1,250) and 142 g (1.0 mol) of 2-acryloyloxyethylisocyanate and 1.0 g each of p-methoxyphenol and di-t-butyl-hydroxytoluene were placed in a reaction vessel equipped with a stirring device, thermometer and condenser. After heating to 60° C. while stirring, heating was discontinued followed by the addition of 0.2 g of dibutyl tin dilaurate. Heating was resumed when the temperature inside the reaction vessel began to drop and stirring was continued at 80° C. The reaction was completed by confirming that the absorption spectrum of the isocyanate group (2,280 $cm^{-1}$) had disappeared based on the infrared absorption spectrum to obtain a urethane acrylate compound in the form of a viscous liquid. The average molecular weight of the resulting urethane acrylate (UA-1) was 1,600.

Preparation Example 2

Synthesis of UA-2

A urethane acrylate compound was synthesized in the same manner as Production Example 1 with the exception of 500 g (0.5 mol) of polycarbonate diol (Daicel Chemical Industries, CD210PL, molecular weight: 1,000) instead of polycaprolactone diol. The number average molecular weight of the resulting urethane acrylate (UA-2) was 1,300.

Preparation Example 3

Synthesis of UA-3

A urethane acrylate compound was synthesized in the same manner as Production Example 1 with the exception of using 425 g (0.5 mol) of polytetramethylene glycol (Hodogaya Chemical Industries, PMTG-850, molecular weight: 850) instead of polycaprolactone diol. The number average molecular weight of the resulting urethane acrylate (UA-3) was 1,200.

Preparation Example 4

Synthesis of UA-4

255 g (0.3 mol) of polytetramethylene glycol (Hodogaya Chemical Industries, PMTG-850, molecular weight: 850), 67 g (0.5 mol) of dimethylol propionic acid, 133 g (0.6 mol) of isophorone diisocyanate, 56.8 g (0.4 mol) of 2-acryloyloxyethylisocyanate and 0.1 g each of p-methoxyphenol and di-t-butyl-hydroxytoluene were placed in a reaction vessel equipped with a stirring device, thermometer and condenser. After heating to 60° C. while stirring, heating was discontinued followed by the addition of 0.1 g of dibutyl tin dilaurate. Heating was resumed when the temperature inside the reaction vessel began to drop and stirring was continued at 80° C. The reaction was completed by confirming that the absorption spectrum of the isocyanate group (2,280 $cm^{-1}$) had disappeared based on the infrared absorption spectrum to obtain a urethane acrylate compound in the form of a viscous liquid.

The number average molecular weight of the resulting urethane acrylate (UA-4) was 22,000 and the acid value was 46 mg KOH/g.

Preparation Example 5

Synthesis of UA-5

A urethane acrylate compound was synthesized in the same manner as Production Example 1 with the exception of using 1000 g (1 mol) of polycarbonate diol (Hodogaya Chemical Industries, CD210PL, average molecular weight: 1,000), 938 g (7 mol) of dimethylol propionic acid, 1,332 g (6 mol) of polyisocyanate in the form of isophorone diisocyanate and 142 g (1.0 mol) of 2-acryloyloxyethylisocyanate. The number average molecular weight of the resulting urethane acrylate (UA-5) was 16,000 and the acid value was 120 mg KOH/g.

Preparation Example 6

Synthesis of UA-6

12.0 parts by weight of methacrylic acid, 14.0 parts by weight of methyl methacrylate, 43.0 parts by weight of butyl methacrylate, 6.0 parts by weight of 2-hydroxyethyl acrylate and 225.0 parts by weight of propylene glycol monomethyl ether were placed in a four-mouth flask equipped with a dropping funnel, thermometer, condenser and stirrer followed by replacing the inside of the four-mouth flask with nitrogen for 1 hour. Moreover, after warming to 90° C. with an oil bath, a mixed liquid of 12.0 parts by weight of methacrylic acid, 14.0 parts by weight of methyl methacrylate, 43.0 parts by weight of butyl methacrylate, 6.0 parts by weight of 2-hydroxyethyl acrylate and 3.2 parts by weight of azo-bis-isobutyronitrile was dropped in over the course of 1 hour. After allowing to polymerize for 3 hours, a mixed liquid of 1.0 parts by weight of azo-bis-isobutyronitrile and 15.0 parts by weight of propylene glycol monomethyl acetate were added followed by raising the temperature to 100° C., allowing to polymerize for 1.5 hours and then allowing to stand to cool.

12.0 parts by weight of 2-acryloyloxyethylisocyanate were then gradually added to this solution followed by stirring for 4 hours at 80° C. The acid value of the resulting urethane acrylate copolymer (UA-6) was 92 mg KOH/g, and the weight average molecular weight as polystyrene measured by GPC was 23,000.

Comparative Preparation Example 1

Synthesis of UA-7

850 g (1 mol) of polytetramethylene glycol (Hodogaya Chemical Industries, PTG-850SN, molecular weight: 850), 938 g (7 mol) of dimethylol propionic acid and 1,998 g (9 mol) of isophorone diisocyanate were placed in a reaction vessel equipped with a stirring device, thermometer and condenser. The reaction was stopped by heating to 60° C. while stirring followed by the addition of 1.4 g of dibutyl tin dilaurate. Heating was resumed to 80° C. when the temperature inside the reaction vessel began to drop and stirring was continued while holding the temperature at 75 to 85° C. The reaction was stopped when the concentration of residual NCO reached the theoretical value to synthesize a urethane oligomer. Moreover, after placing 0.9 g each of p-methoxyphenol and di-b-butyl-hydroxytoluene in the reaction vessel, 238 g (2.05 mol) of 2-hydroxyethyl acrylate were added to resume the reaction. The reaction was completed by confirming that the absorption spectrum of the isocyanate group (2,280 cm$^{-1}$) had disappeared based on the infrared absorption spectrum to obtain a urethane acrylate compound in the form of a viscous liquid. The number average molecular weight of the resulting urethane acrylate (UA-7) was 16,000 and the acid value was 90 mg KOH/g.

Comparative Preparation Example 2

Synthesis of UA-8

A urethane acrylate compound was produced in the same manner as Production Example 1 with the exception of using an equimolar amount of 2-methacryloyloxyethylisocyanate instead of the 2-acryloyloxyethylisocyanate to obtain urethane acrylate (UA-8).

Examples 1 to 9 and Comparative Examples 1 and 2

The urethane acrylate compounds produced in the manner described above, compounds (B) having an ethylenic unsaturated group, thermosetting resins (C), photopolymerization initiators (D) and thermal polymerization catalyst (E) were mixed at the blending ratios (parts by weight) shown in the following Table 1 to prepare compositions. The bisphenol A type resin EPICON 860 (Dainippon Ink and Chemicals), the cresol Novolak type epoxy resin EPICON N660 (Dainippon Ink and Chemicals) and the biphenyl type epoxy resin YL6121H (Yuka-Shell Epoxy) were used for the thermosetting resin (C). The 2,4,6-trimethylbenzoylphenyl phosphine oxide TPO (BASF) and the 4,4'-bis(diethylamino)benzophenone EAB-F (Hodogaya Chemical Industries) were used for the photopolymerization initiator (D). Melamine PC-1 (Nissan Chemical Industries) was used for the thermal polymerization catalyst.

TABLE 1

|     |      |             | Ex. 1 | Ex. 2 | Ex. 3 | Ex. 4 | Ex. 5 | Ex. 6 | Ex. 7 | Ex. 8 | Ex. 9 | Comp. Ex. 1 | Comp. Ex. 2 |
|-----|------|-------------|-------|-------|-------|-------|-------|-------|-------|-------|-------|-------------|-------------|
| (A) | UA-1 | Pts. by wgt. | 65    | —     | —     | —     | —     | —     | —     | —     | 40    | —           | —           |
|     | UA-2 | Pts. by wgt. | —     | 65    | —     | —     | —     | —     | —     | —     | —     | —           | —           |
|     | UA-3 | Pts. by wgt. | —     | —     | 65    | —     | —     | —     | —     | —     | —     | —           | —           |
|     | UA-4 | Pts. by wgt. | —     | —     | —     | 65    | —     | —     | —     | —     | —     | —           | —           |
|     | UA-5 | Pts. by wgt. | —     | —     | —     | —     | 65    | —     | —     | —     | —     | —           | —           |
|     | UA-6 | Pts. by wgt. | —     | —     | —     | —     | —     | 65    | 65    | 65    | —     | —           | —           |
| (B) | UA-7 | Pts. by wgt. | 22    | 22    | 22    | 22    | 22    | 22    | 22    | 22    | 47    | 87          | 65          |
|     | UA-8 | Pts. by wgt. | —     | —     | —     | —     | —     | —     | —     | —     | —     | —           | 22          |

TABLE 1-continued

|   |   |   | Ex. 1 | Ex. 2 | Ex. 3 | Ex. 4 | Ex. 5 | Ex. 6 | Ex. 7 | Ex. 8 | Ex. 9 | Comp. Ex. 1 | Comp. Ex. 2 |
|---|---|---|---|---|---|---|---|---|---|---|---|---|---|
| (C) | EPICON860 | Pts. by wgt. | 25 | 25 | 25 | 25 | 25 | 25 | — | — | 25 | 25 | 25 |
|   | EPICONN660 | Pts. by wgt. | — | — | — | — | — | — | 25 | — | — | — | — |
|   | YL6121H | Pts. by wgt. | — | — | — | — | — | — | — | 25 | — | — | — |
| (D) | TPO | Pts. by wgt. | 2.2 | 2.2 | 2.2 | 2.2 | 2.2 | 2.2 | 2.2 | 2.2 | 2.2 | 2.2 | 2.2 |
|   | EAB-F | Pts. by wgt. | 2.2 | 2.2 | 2.2 | 2.2 | 2.2 | 2.2 | 2.2 | 2.2 | 2.2 | 2.2 | 2.2 |
| (E) | PC-1 | Pts. by wgt. | 2.5 | 2.5 | 2.5 | 2.5 | 2.5 | 2.5 | 2.5 | 2.5 | 2.5 | 2.5 | 2.5 |
| Electroless gold plating resistance | | | A | A | A | A | A | A | A | A | A | C | C |

Preparation of Dry Films

Methylcellusorb acetate was added to the photosensitive compositions prepared at the blending ratios shown in Table 1 and adjusted to a viscosity of 5,000 mPa·s followed by coating onto a polyethylene terephthalate film having a thickness of 23 μm using doctor plate and drying for 5 minutes at 80° C. to form a photosensitive layer. Subsequently, a 30 μm polyethylene film was laminated onto the photosensitive layer to produce photosensitive dry films having a cover film. The film thickness of the photosensitive layer after drying was 30±1 μm.

Preparation of Laminate Test Pieces

A printed board in which copper foil having a thickness of 35 μm was laminated onto one side of a polyimide film having a thickness of 50 μm (obtained by washing Upicel N (registered trademark, Ube Industries) with 1% aqueous sulfuric acid solution and rinsing with water followed by drying in flowing air) was heated to 60° C. Next, the cover film of the photosensitive dry films produced above was peeled off followed by heating the photosensitive layer to 70° C. and laminating onto the aforementioned printed board with a laminator equipped with a press roll.

Exposure, Development and Heat Curing of Laminated Test Pieces

Each of the aforementioned laminated test pieces were exposed at 500 mJ/cm² using a negative pattern having a square shape measuring 1 cm×1 cm over a range of 4 cm×6 cm with the HMW-680GW exposure system (Oak) equipped with a metal halide lamp. Next, after developing by removing the unexposed portion by spraying a 1% by weight sodium carbonate solution aqueous solution at 30° C. for 60 seconds, the test pieces were heat-treated for 30 minutes at 150° C. and obtain copper-laminated laminates in which the copper foil was exposed in the shape of a square measuring 1 cm×1 cm.

Electroless Gold Plating Resistance

The copper-laminated laminates obtained above were subjected to electroless gold plating in the manner of the process described below, and the test pieces were evaluated for changes in appearance and separation of the resist by carrying out a peeling test using cellophane tape. Those results are shown in the aforementioned Table 1.

A: No change in appearance and no separation of resist
B: No change in appearance but slight separation of resist
C: Lifting of resist, plating present between resist and copper foil, and considerable peeling of resist during peeling test Electroless Gold Plating Process Resin: The test pieces were immersed for 3 minutes in an acidic degreasing solution (20 vol % aqueous solution of Metex L-5B, Nippon MacDermid) at 30° C.

Rinsing: The test pieces were immersed in running water for 3 minutes.

Soft Etching: The test pieces were immersed for 1 minute in 14.3 wt % aqueous ammonium persulfate solution at room temperature.

Rinsing: The test pieces were immersed in running water for 3 minutes.

Acid immersion: The test pieces were immersed in 10 vol % aqueous sulfuric acid for 1 minute at room temperature.

Rinsing: The test pieces were immersed in running water for 30 seconds to 1 minute.

Addition of Catalyst: The test pieces were immersed in a catalyst solution (10 vol % aqueous solution of Metal Plate Activator 350, Meltex) for 7 minutes at 30° C.

Rinsing: The test pieces were immersed in running water for 3 minutes.

Electroless Nickel Plating (Gold Plating Substrate Layer): The test pieces were immersed in a nickel plating solution (20 vol % aqueous solution of Melplate Ni-865M, Meltex) at 85° C. and pH 4.6 for 20 minutes.

Acid Immersion: The test pieces were immersed in 10 vol % aqueous sulfuric acid for 1 minute at room temperature.

Rinsing: The test pieces were immersed in running water for 30 seconds to 1 minute.

Electroless Gold Plating: The test pieces were immersed in a gold plating solution (3 vol % aqueous solution of Aurolectroless UP containing 15 vol % potassium cyamide, Meltex) at 95° C. and pH 6 for 10 minutes.

Rinsing: The test pieces were immersed in running water for 3 minutes.

Hot Water Rinsing: The test pieces were immersed in hot water at 60° C. and after adequately rinsing for 3 minutes, the water was completely drained off and the test pieces were dried to obtain electroless gold plated test pieces.

INDUSTRIAL APPLICABILITY

As has been described above, a composition of the present invention has superior electroless gold plating resistance as a result of containing a specific urethane acrylate compound (A). In addition, since a composition of the present invention allows the formation of a cured film having flexibility and superior photosensitivity and developing characteristics while simultaneously satisfying performance requirements such as heat resistance, electrical insulation and adhesion to a printed wiring board, it is suitably used as an insulating protective coating of an FPC or other printed circuit board.

The invention claimed is:
1. A photosensitive resin composition comprising: a photopolymerizable component containing a urethane acrylate compound (A) a compound (B) having an ethylenic unsaturated group other than said urethane acrylate compound (A), an epoxy resin as a thermosetting resin (C), a photopolymer- ization initiator (D), and a thermal polymerization catalyst (E); wherein said urethane acrylate compound (A) is the reaction product of an isocyanate compound (a-1) of the following general formula (1):

$$CH_2=CH-COO-R-NCO \quad (1)$$

(wherein R represents a hydrocarbon group having 1 to 30 carbon atoms) with polyhydroxy compounds (a-2), wherein at least one of said polyhydroxy compounds (1-2) is a polyol compound having a carboxyl group, and wherein the number average molecular weight of the urethane acrylate compound (A) is 1,000 to 40,000, and the acid value of the urethane acrylate compound (A) is 5 to 150 mg KOH/g.

2. The photosensitive resin composition according to claim 1 further comprising an organic solvent.

3. The photosensitive resin composition according to claim 2 wherein the viscosity of the composition at 25° C. is 500 to 500,000 mPa·s.

4. The photosensitive resin composition according to claim 1 wherein the composition is used as a resist.

5. The photosensitive resin composition according to claim 1 wherein the composition is used as a solder resist.

6. A dry film resist having on a support a photosensitive layer formed from the photosensitive resin composition according to claim 1.

7. The dry film resist according to claim 6 wherein the support is a polyester film.

8. A process for the preparation of a dry film resist having a photosensitive layer formation step in which the photosensitive resin composition according to claim 1 is coated onto a support and dried.

9. A cured product formed from the photosensitive resin composition according to claim 1.

10. An insulating protective coating formed using the photosensitive resin composition according to claim 1.

11. A printed circuit board having the insulating protective coating according to claim 10.

12. The printed circuit board according to claim 11 that is a flexible printed wiring board.

13. A process for the preparation of a printed circuit board comprising a lamination step in which a photosensitive layer of the dry film resist according to claim 6 and a substrate are laminated, an exposure step in which the photosensitive layer is exposed, a developing step following the exposure step, and a thermosetting step in which the photosensitive layer is heat-cured.

14. A process for the preparation of a printed circuit board comprising a lamination step in which a photosensitive layer of the dry film resist according to claim 7 and a substrate are laminated, an exposure step in which the photosensitive layer is exposed, a developing step following the exposure step, and a thermosetting step in which the photosensitive layer is heat-cured.

* * * * *